(12) United States Patent
Yuan et al.

(10) Patent No.: US 8,336,194 B2
(45) Date of Patent: Dec. 25, 2012

(54) METHOD OF FABRICATING A TUNNELING MAGNETORESISTIVE (TMR) READER

(75) Inventors: Lu Yuan, Fremont, CA (US); Jian X. Shen, Pleasanton, CA (US); Geoffrey W. Anderson, Dublin, CA (US); Christopher Ng, Union City, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 354 days.

(21) Appl. No.: 12/611,855

(22) Filed: Nov. 3, 2009

(65) Prior Publication Data

US 2011/0102949 A1 May 5, 2011

(51) Int. Cl.
*G11B 5/127* (2006.01)
*H04R 31/00* (2006.01)

(52) U.S. Cl. ............... 29/603.14; 29/603.11; 29/603.13; 29/603.15; 29/603.16; 29/603.18; 216/22; 216/39; 216/40; 216/65; 216/66; 360/324.1; 360/324.12; 360/324.2; 451/5; 451/41

(58) Field of Classification Search ............... 29/603.07, 29/603.08, 603.11–603.16, 603.18; 216/22, 216/39, 40, 65, 66; 360/324.1, 324.12, 324.2; 451/5, 41
See application file for complete search history.

(56) References Cited

U.S. PATENT DOCUMENTS

| | | | |
|---|---|---|---|
| 5,804,250 A | 9/1998 | Yang | |
| 6,033,491 A | 3/2000 | Lin | |
| 6,129,957 A * | 10/2000 | Xiao et al. | ............ 427/548 |
| 6,315,839 B1 | 11/2001 | Pinarbasi et al. | |
| 6,322,640 B1 | 11/2001 | Xiao et al. | |
| 6,413,325 B1 | 7/2002 | Shimazawa et al. | |
| 6,430,015 B2 | 8/2002 | Ju et al. | |
| 6,452,385 B1 | 9/2002 | Shimazawa et al. | |
| 6,478,884 B2 | 11/2002 | Shimazawa et al. | |
| 6,724,581 B2 | 4/2004 | Westwood | |
| 6,754,048 B2 | 6/2004 | Li et al. | |
| 6,848,169 B2 | 2/2005 | Shin et al. | |
| 6,876,507 B2 | 4/2005 | Chen et al. | |
| 6,998,061 B1 | 2/2006 | Cross | |
| 2004/0196681 A1 | 10/2004 | Xiao et al. | |
| 2009/0128944 A1 | 5/2009 | Jang et al. | |
| 2009/0229111 A1* | 9/2009 | Zhao et al. | ............ 29/603.08 |

OTHER PUBLICATIONS

Shinji Yuasa, et al., "Giant room-temperature magnetoresistance in single-crystal Fe/MgO/Fe magnetic tunnel junctions," Nature Materials, vol. 3, Dec. 2004, pp. 868-871.

Stuart S.P. Parkin, et al., "Giant tunnelling magnetoresistance at room temperature with MgO (100) tunnel barriers", Nature Materials, vol. 3, Dec. 2004, pp. 862-867.

\* cited by examiner

*Primary Examiner* — Paul D Kim

(57) ABSTRACT

A method of fabricating a tunneling magnetoresistance (TMR) reader is disclosed. A TMR structure comprising at least one ferromagnetic layer and at least one nonmagnetic insulating layer is provided. A first thermal annealing process on the TMR structure is performed. A reader pattern definition process performed on the TMR structure to obtain a patterned TMR reader. A second thermal annealing process is performed on the patterned TMR reader.

19 Claims, 5 Drawing Sheets

METHOD OF FABRICATING A TUNNELING MAGNETORESISTIVE (TMR) READER

FIELD OF THE INVENTION

The present invention generally relates to fabrication of magnetic readers and writers and, in particular, relates to a method to improve reader stability and writer overwrite performance by patterned wafer annealing.

BACKGROUND OF THE INVENTION

Perpendicular magnetic recording (PMR), in which the recorded bits are stored in the generally planar recording layer in a generally perpendicular or out-of-plane orientation, is a promising path toward ultra-high recording densities in magnetic recording hard disk drives.

A PMR write head (writer) and a PMR read head (reader) are typically formed as an integrated read/write head on an air-bearing slider. The slider is attached to an actuator arm by a suspension and positioned very close to the disk surface by the suspension. The actuator moves the slider across the disk surface so that the read/write head can access the data tracks. There are typically a stack of disks in the disk drive with a slider-suspension assembly associated with each disk surface in the stack.

In a PMR writer, a write current passes through a writer coil disposed adjacent to a magnetic yoke to induce a strong write magnetic field at a write pole to write data in a recording media. The recording layer has perpendicularly recorded magnetizations or magnetized regions that form a data track, with adjacent regions in the data track having opposite magnetization directions. As long as the write magnetic field at the write pole is strong enough, data written in the recording layer can be erased or "overwritten". In fact, the overwrite operation is a popular way to erase data in a magnetic recording hard drive. However, if the induced magnetic field is not strong enough, the overwrite or erasing may not be fully effectuated in all magnetic regions, thereby causing data errors in subsequent recordings.

In a PMR reader, a tunnel magnetoresistance (TMR) sensor is frequently employed in the read head. The TMR sensor includes a patterned TMR structure or stack having two ferromagnetic layers separated by an insulating (e.g., MgO) barrier layer. One ferromagnetic layer is magnetically oriented in a fixed direction (the "pinned layer") and the other ferromagnetic layer rotates in response to an external magnetic field (the "free layer"). The TMR sensor also includes a hard bias layer disposed on either side of the TMR stack. The hard bias layer includes a permanent magnetic material, such as cobalt platinum (CoPt), and provides a bias field along a direction perpendicular to layers of the TMR stack. The resistance of the device is dependent on the relative orientation between the two ferromagnetic layers. In a perpendicular magnetic recording (PMR) read head, a sense current passes perpendicularly through layers of the TMR stack. The magnetic transitions between adjacent oppositely-directed magnetized regions cause changes in electrical resistance that are detected by the TMR sensor.

The amplitude of a readback signal of a PMR reader can be asymmetric. Readback signal amplitude asymmetry means that the amplitude of the pulses from magnetizations recorded in one direction (e.g., the "positive" direction) is different from the amplitude of the pulses from magnetizations recorded in the opposite direction (e.g., the "negative" direction). The amplitude asymmetry (AASY) measured in percent can be expressed as $[(S_P-S_N)/(S_P+S_N)]*100$, where $S_P$ represents the measured amplitude of the pulses from magnetizations recorded in one direction and $S_N$ represents the measured amplitude of the pulses from magnetizations recorded in the other direction. A high value of AASY is undesirable in that it has a deleterious effect on the stability of the read head by causing a high bit error rate (BER) when the data is read back.

To some degree, AASY is a result of the construction of the reader. It is, however, also believed that spurious magnetic fields arising from the media background and other sources also contribute to amplitude asymmetry. For example, rapidly increasing track density requires decreasing reader track width. As the reader track width decreases, de-magnetic fields from P1 and P2 layers rapidly increases, and the increased de-magnetic field, in turn, causes reader stability degradation by increasing the AASY.

A conventional scheme for improving the reader stability is to increase the hard bias field by increasing the thickness of the hard bias layer. However, with increasing track density, there is a requirement to reduce a shield-to-shield spacing for the TMR sensor stack. Therefore, it is often neither desirable nor practical to increase the hard bias layer thickness to improve the ASSY. In addition, an increase in the hard bias thickness causes a significant reduction in the reader amplitude which may not be a good compromise for the improved reader stability.

Therefore, a need exists for a scheme for improving the reader stability without a structural change to the existing read head design (e.g., an increase in hard bias layer thickness). In addition, a need also exists to improve the overwrite performance of a writer by increasing the write magnetic field at the write pole without a structural change to the existing write head design.

SUMMARY OF THE INVENTION

Various embodiments of the subject disclosure address the aforementioned need to improve the reader stability by adding a second thermal annealing process after defining (e.g., patterning) the TMR stack. In addition, some embodiments of the subject disclosure address the aforementioned need to improve the overwrite performance by adding a third thermal annealing process after defining the writer.

According to one embodiment of the subject disclosure, a method of fabricating a tunneling magnetoresistance (TMR) reader is disclosed. The method can comprise providing a TMR structure comprising at least one ferromagnetic layer and at least one nonmagnetic insulating layer. The method can further comprise performing a first thermal annealing process on the TMR structure. The method can further comprise performing a reader pattern definition process on the TMR structure to obtain a patterned TMR reader. The method can further comprise performing a second thermal annealing process on the patterned TMR reader.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
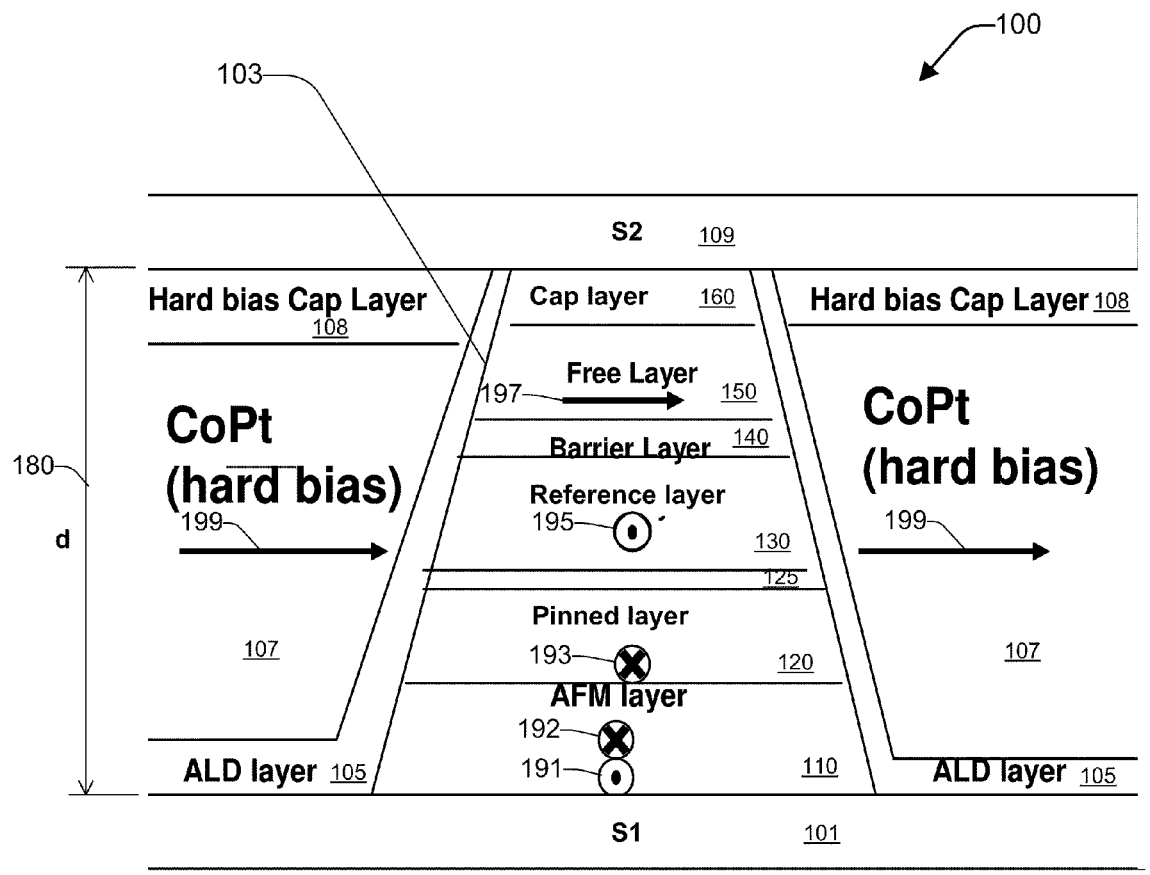
FIG. 1 is a diagram depicting an exemplary TMR reader according to one aspect of the subject disclosure.

FIG. 1 is a diagram depicting an exemplary TMR reader 100 according to one aspect of the subject disclosure. The TMR reader 100 includes a patterned TMR stack 103 disposed between a first (bottom) shield layer (S1) 101 and a second (top) shield layer (S2) 109 and having a shield-to-shield distance (d) 180. The TMR reader 100 further includes a hard bias layer 107; an insulating spacer layer 105, typically comprising atomic layer deposition (ALD) alumina ($Al_2O_3$), disposed between the first shield layer 101 and the patterned TMR stack 103; and a hard bias cap layer 108 disposed between the hard bias layer 107 and the second shield layer 109. In certain embodiments, the top and bottom shield layer 109, 101 function as top and bottom electrodes as well as magnetic shields. For simplicity, FIG. 1 is not drawn to scale.

The patterned TMR stack 101 comprises a plurality of TMR layers 110-160 including: a pinning or anti-ferromagnetic (AFM) layer 110 disposed over the first shield layer 101; a pinned layer 120 disposed over the AFM layer 110; a spacer layer 125 typically comprising ruthenium (Ru) disposed over the pinned layer 120; a reference layer 130 disposed above the spacer layer 125; a tunneling barrier layer 140 disposed over the reference layer 130; a free layer 150 disposed over the tunneling barrier layer 140; and a TMR cap layer 160 disposed over the free layer 150.

In the following discussion, the tunneling barrier layer 140 is assumed to be a crystalline magnesium oxide (MgO) tunneling barrier layer. However, it shall be appreciated that the tunneling barrier layer 140 can comprise any thin insulating material layer that allows an electron to tunnel between the free and reference layers. The pinned layer 120 and the reference layer 130 separated by the thin nonmagnetic, conductive (Ru) spacer layer 125 constitute a synthetic magnet for the TMR stack 103.

In the illustrated example of FIG. 1, magnetizations or moments of the pinned layer 120 and the reference layer 130 (indicated by arrow 193 and arrow 195, respectively) are substantially fixed or pinned and are pointing in opposite directions. In particular, the magnetization or moment of the pinned layer 130 is pinned in a particular direction, typically by an exchange-bias interaction with magnetizations or moments (indicated by arrows 191, 192) of the AFM layer 120. However, a magnetization or moment of the free layer 150 (indicated by arrow 197) may move, or switch, in response to an external field such as of a magnetic recording medium.

The hard bias layer 107 disposed on either side of the patterned TMR stack 103 comprises a permanent magnetic material The permanent magnetic material of the hard bias layer 107 generates a hard bias field (indicated by arrow 199) pointing in a direction substantially parallel to the planes of the TMR layers 110-160 to bias the magnetization of the free layer 150. Although the permanent magnetic material comprises a composition of cobalt and platinum (CoPt) in the illustrated example of FIG. 1, other permanent magnetic materials such as a composition of cobalt, platinum, and chrome (CoPtCr) or a composition of iron and platinum (FePt) may be alternatively used.

The hard bias field 199 generated by the hard bias layer 107 passes through and sets up a sufficiently high effective hard bias field inside the patterned sensor stack 103 that is perpendicular to the stack layers. The effective hard bias field in turn affects transfer characteristics (e.g., TMR ratio versus an external magnetic field) of the patterned TMR stack 103 at least in part by affecting the rotation behavior of the free layer magnetization. Properties (e.g., the magnitude) of the effective hard bias field may be inferred from the transfer characteristics being affected by the field.

Figure 2A:
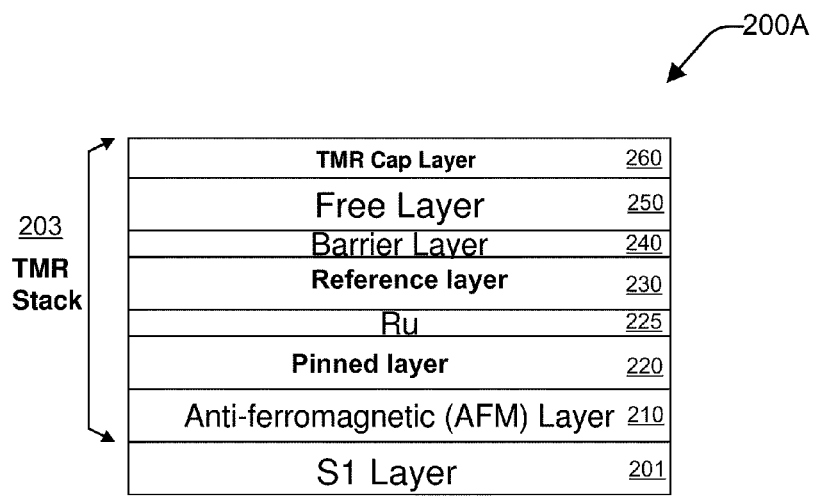
FIG. 2A is a diagram depicting a pre-patterned TMR reader structure formed via a TMR stack deposition process according to one aspect of the subject disclosure.
Figure 2B:
FIG. 2B is a diagram (ABS view) depicting a step for forming a first intermediate patterned TMR reader structure having a hard bias layer or junction according to one aspect of the subject disclosure.
Figure 2C:
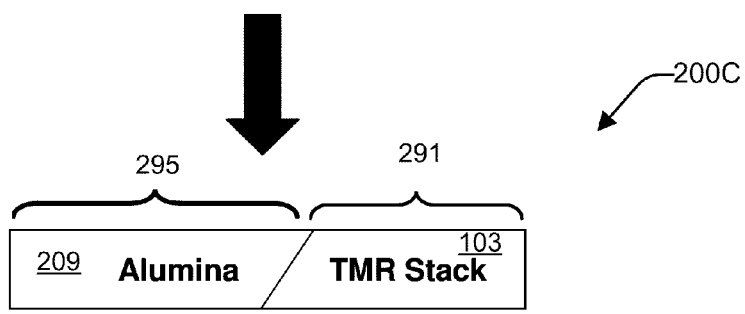
FIG. 2C is a diagram (APEX view) depicting a step for forming a second intermediate patterned TMR reader structure having a fully patterned TMR stack according to one aspect of the subject disclosure.

The electrical resistance through the tunneling barrier layer 140 varies with the relative orientation of the free layer magnetization compared with the reference layer magnetization and thereby converts magnetic signals into electrical signals. When a sense current is passed from the first shield (S1) 101 to the second shield (S2) 109 in a direction perpendicular to the planes of the TMR layers 110-160, a lower resistance is detected when the magnetization directions of the free and reference layers are in a parallel state and a higher resistance is detected when the magnetization directions are not in a parallel state FIGS. 2A-C represent a sequence of diagrams illustrating an exemplary fabrication process for a PMR TMR reader such as the TMR reader 100 of FIG. 1. FIG. 2A is a diagram depicting a pre-patterned TMR reader structure 200A formed via a TMR stack deposition process. The pre-patterned TMR reader structure 200A includes various layers 201, 210-260 whose patterned counterparts 101, 110-160 are described above with respect to FIG. 1. In the illustrated example, the pre-patterned TMR reader structure 200A comprises a first (bottom) shield layer (51) 201 and a pre-patterned TMR stack 203 disposed above the first shield layer 201. The pre-patterned TMR stack 203 includes various TMR layers 210-260 including: an AFM layer 210 deposited over the first shield layer 201; a pinned layer 220 deposited over the AFM layer 210; a spacer (e.g., Ru) layer 225 deposited over the pinned layer 220; a reference layer 230 deposited over the spacer layer 225; a tunneling barrier layer 240 deposited over the reference layer 230; a free layer 250 deposited over the tunneling barrier layer 240; and a TMR cap layer 260 deposited over the free layer 250. Various methods for the TMR stack deposition are known in the art and are not described herein for the sake of brevity.

After the TMR stack deposition, the pre-patterned TMR reader structure 200A undergoes a number of reader pattern definition processes. FIG. 2B is a diagram (ABS view) depicting a step for forming a first intermediate patterned TMR reader structure 200B having a hard bias layer 207. This step includes but is not limited to: forming a resist pattern on the pre-patterned TMR stack 203; performing an ion-milling operation on the stack 203 to form an intermediate patterned TMR stack 103A; depositing the insulation space layer (e.g., ALD $Al_2O_3$) 105; depositing the hard bias layer 207 and the hard bias cap layer 108 (FIG. 1); and performing a lift-off operation.

FIG. 2C is a diagram (APEX view) depicting a step for forming a second intermediate patterned TMR reader structure 200C having a fully patterned TMR stack 103. This step includes but is not limited to: forming a resist pattern on the first intermediate patterned TMR stack 103A; performing a milling operation on an area of the first intermediate patterned TMR stack 103A to define back of a reader stripe 291; refilling the milled area 295 with alumina 209; and performing a lift-off operation. Subsequently, a second shield layer (S2) is added to the second intermediate patterned TMR reader structure 200C thus formed to arrive at the TMR reader 100 of FIG. 1.

While some layers or materials were described above as being "disposed over" or "deposited over" previous layers or materials (e.g., the free layer 250 deposited over the tunneling barrier layer 240) for the illustrated embodiments of FIGS. 1 and 2A-C, it shall be appreciated that, in other embodiments, each of the layers or materials may be disposed or deposited below or aside or otherwise adjacent to a side of the previous layer or material depending on the orientation and arrangement of the structure being patterned or the patterning process being employed. Furthermore, as used herein, the phrase "Layer/Material X disposed/deposited over (below, aside, or adjacent to a side of) Layer/Material Y" encompasses those arrangements or embodiments in which there is one or more intermediate layers or materials disposed/deposited between the Layer/Material X and the Layer/Material Y.

Figure 3:
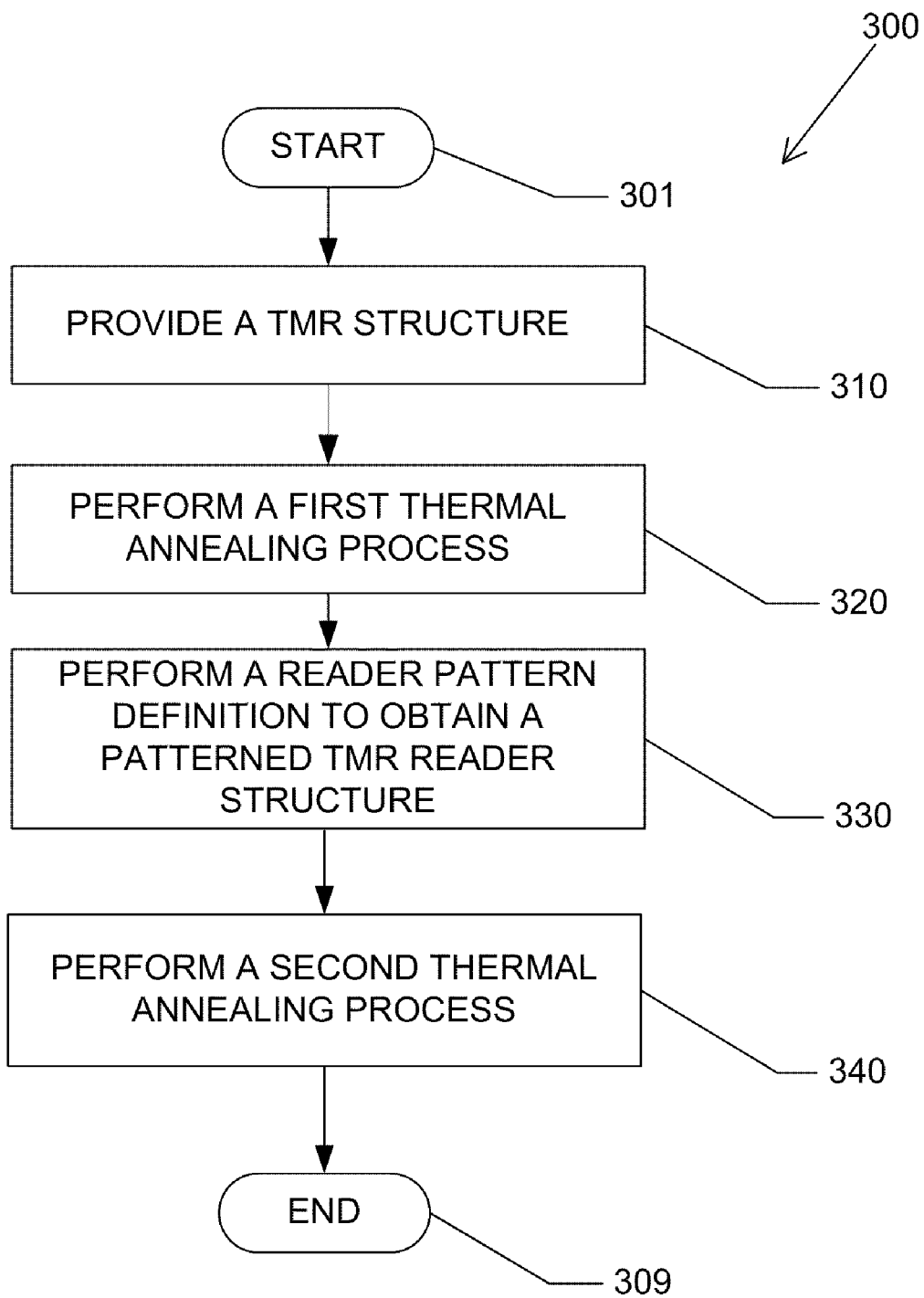
FIG. 3 is a flowchart illustrating an exemplary process for obtaining a TMR reader having an improved reader stability by performing a thermal annealing process on a patterned TMR reader according to one aspect of the subject disclosure.

FIG. 3 is a flowchart illustrating an exemplary process 300 for obtaining a TMR reader having an improved reader stability by performing a thermal annealing process on a patterned TMR reader according to one aspect of the subject disclosure. For the sake of clarity only without the intention to limit the scope of the subject disclosure in any way, the process 300 will be described below with references to FIG. 1 and FIGS. 2A-C. However, it shall be appreciated that the process 300, or a variation thereof, may be applied to obtain a TMR reader having a different structure than the TMR reader structures shown in those figures. The process 300 begins at start state 301 and proceeds to operation 310 in which a TMR structure is provided. The operation 310 can involve the TMR stack deposition discussed above with respect to FIG. 2A in which various TMR layers including at least one ferromagnetic layer (e.g., one or more of the AFM layer 210, the pinned layer 220, the reference layer 230, and the free layer 250) and at least one nonmagnetic insulating layer (e.g., the tunneling barrier layer 240) are deposited to form a pre-patterned TMR stack such as the pre-patterned TMR stack 203 of FIG. 2A.

The process 300 proceeds to operation 320 in which a first thermal annealing process is performed on the pre-patterned TMR stack 203. The first thermal annealing process helps to increase the TMR effect (e.g., dR/R) by correctly forming a crystalline structure for the nonmagnetic insulating material (e.g., MgO) of the tunneling barrier layer 240. The same thermal annealing process also can serve to form an antiferromagnetic (AFM) material (InMn) in the AFM layer 210 to a correct phase, so that a pinning field can be induced therein. In certain embodiments, the first thermal annealing process has a first thermal annealing temperature in a range of between about 250 and 300° C. and a soaking time in a range of between about 2 and 5 hours. In the illustrated example, the first thermal annealing process is performed after the deposition of the TMR cap layer 260.

It shall be appreciated by one skilled in the art that various modifications to the first thermal annealing process of operation 320 described above can be modified to arrive at numerous alternative embodiments without departing from the scope of the subject disclosure. For example, the first thermal annealing process can be performed before the deposition of the TMR cap layer 260 or even before the deposition of the free layer 250. In some embodiments, the first thermal annealing process can involve two or more thermal annealing processes performed at different times during the TMR stack formation. For example, an initial thermal annealing process can be performed after depositing the AFM layer 210, and another subsequent thermal annealing process can be performed at some time after depositing the tunneling barrier layer 240.

The process 300 proceeds to operation 330 in which various reader pattern definition operations described above with respect to FIGS. 2A and 2B are performed on the pre-patterned TMR reader structure 200A to arrive at a patterned TMR reader structure such as the patterned TMR reader 100 of FIG. 1.

The process 300 then proceeds to operation 340 in which a second thermal annealing process is performed on the patterned TMR reader structure to improve the reader stability. In certain embodiments, a second annealing temperature for the second thermal annealing process is equal to or lower than a first annealing temperature for the first thermal annealing process. For example, the first annealing temperature can be in a range of between about 250 and 300° C., and the second annealing temperature can be in a range of between about 220 and 270° C. In some embodiments, a second soaking time for the second thermal annealing process is equal to or lower than a first soaking time for the first thermal annealing process. For example, the first soaking time can be in a range of between about 2 and 5 hours, and the second soaking time can be in a range of between about 10 minutes and 1 hour. The process 300 ends at end state 309.

It shall be appreciated by one skilled in the art that various modifications to the second thermal annealing process of operation 340 described above can be modified to arrive at numerous alternative embodiments without departing from the scope of the subject disclosure. As alluded to above, in certain embodiments, the second thermal annealing process is performed on the patterned TMR reader 100 (FIG. 1). However, in other embodiments, the second thermal annealing process can be performed earlier in the fabrication process on the first intermediate patterned TMR reader structure 200B (FIG. 2B), the second intermediate patterned TMR reader structure 200C (FIG. 2C), or any other intermediate structure arrived at between the pre-patterned TMR reader structure 200A (FIG. 2A) and the final TMR reader 100 (FIG. 1).

Experiments have shown that performing such an additional thermal annealing process on a patterned TMR reader improves the reader stability by increasing the effective hard bias field in the patterned TMR stack 103. As alluded to above, the effective hard bias field can be inferred from the transfer characteristics (e.g., TMR ratio versus external magnetic field) of the reader. The increase in the effective hard bias field in turn has an effect of significantly decreasing an asymmetry sigma (defined as a variation in the ASSY) for the reader while degrading the reader signal amplitude less than expected, e.g., less than would be the case if the same amount of increase in the effective hard bias field were brought about by an increase in the external hard bias field. For example, in one experimental embodiment, subjecting the patterned TMR reader to a second thermal annealing produced a 4% better asymmetry sigma while the reader signal amplitude decreased by 15% and BQST yield showed a 5% improvement.

Figure 4:
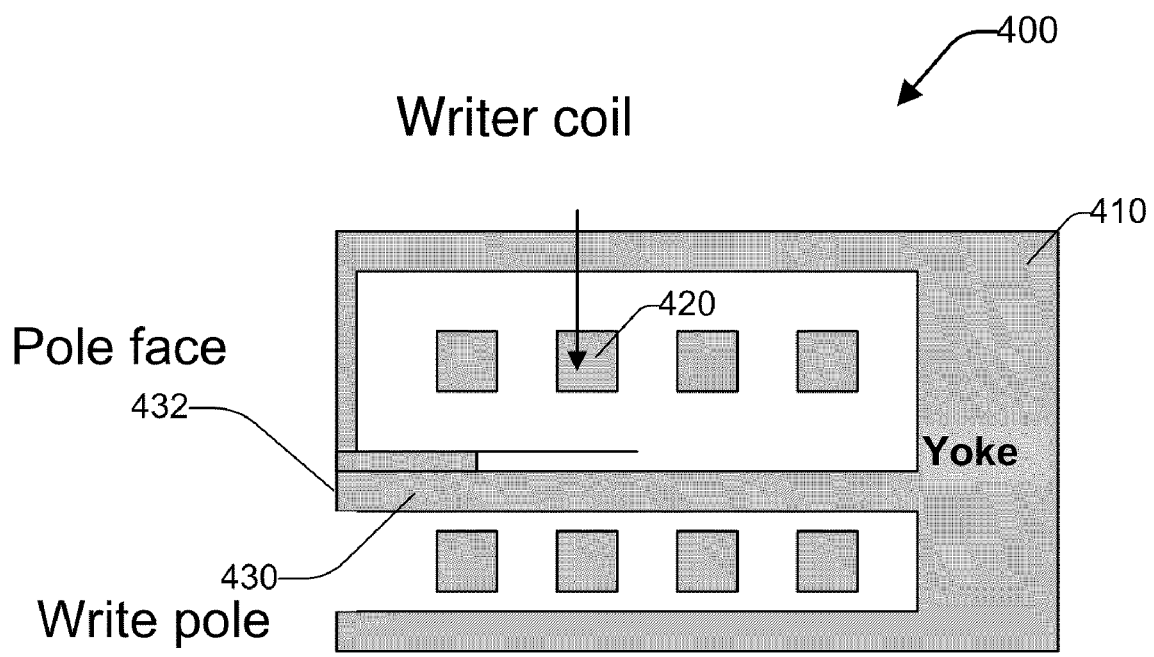
FIG. 4 is a diagram depicting a PMR writer according to one aspect of the subject disclosure.

In some magnetic recording hard drives, a writer such as a PMR writer 400 shown in FIG. 4 can be patterned after patterning a reader such as the TMR reader 100 shown in FIG. 1 to form an integrated read/write head. The PMR writer 400 of FIG. 4 includes a magnetic yoke 410, a write pole 430, and a writer coil 420 disposed relative to the write pole 430. In the illustrated example, the writer coil 420 is a donut or solenoid-shaped coil wrapped around the write pole 430. Pole face 432 of the write pole 430 is facing towards a recording medium (not shown). In an overwrite operation, a write magnetic field or flux in the writer pole 430 generated or induced by a current flowing in the writer coil 420 flows out of the write pole 430 at the end face 432 and enters the recording medium to overwrite or erase any data recorded thereon by erasing or reversing any magnetizations set up inside the recording medium.

Figure 5:
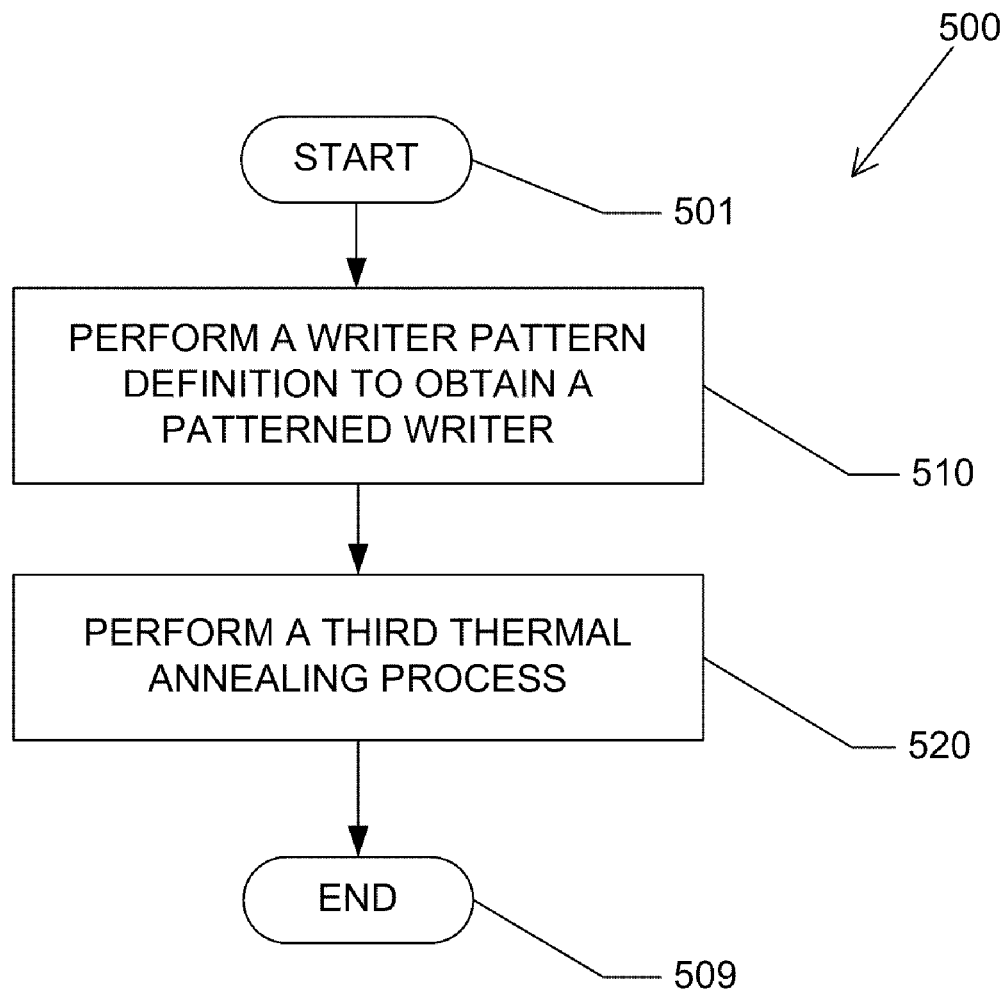
FIG. 5 is a flowchart illustrating an exemplary process for obtaining a PMR writer having an improved overwrite performance by performing a thermal annealing process on a patterned PMR writer according to one aspect of the subject disclosure.

FIG. 5 is a flowchart illustrating an exemplary process 500 for obtaining a PMR writer having an improved overwrite performance by performing a thermal annealing process on a patterned PMR writer according to one aspect of the subject disclosure. For the sake of clarity only without the intention to limit the scope of the subject disclosure in any way, the process 500 will be described below with references to FIG. 4. However, it shall be appreciated that the process 500, or a variation thereof, may be applied to a writer having a different structure than the PMR writer 400 shown in FIG. 4. For example, the writer may have a pancake-shaped coil instead of the donut or solenoid-shaped coil 420 shown in FIG. 4.

The process 500 begins at start state 501 and proceeds to operation 510 in which a writer pattern definition is performed on a pre-patterned writer structure to obtain a patterned PMR writer such as the PMR writer 400. The process 500 proceeds to operation 520 in which a third thermal annealing process is performed on the patterned PMR writer. In certain embodiments, a third annealing temperature for the third thermal annealing process is equal to or lower than a first annealing temperature for the first thermal annealing process discussed above with respect to FIG. 3. For example, the first annealing temperature can be in a range of between about 250 and 300° C., and the third annealing temperature can be in a range of between about 190 and 240° C. In some embodiments, a third soaking time for the third thermal annealing process is equal to or lower than a first soaking time for the first thermal annealing process. For example, the first soaking time can be in a range of between about 2 and 5 hours, and the second soaking time can be in a range of between about 10 minutes and 2 hours.

Experiments have shown that performing such an additional thermal annealing process on a patterned PMR writer improves the overwrite performance of the writer. For example, in one experimental embodiment, subjecting a patterned PMR writer to a third thermal annealing produced an 1.5 db improvement in the overwrite performance. The improvement is believed to be attributable to the additional annealing process increasing the magnetic permeability of the magnetic yoke, which in turn causes an increase in the net magnetic flux generated by the write pole 420.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method of fabricating a tunneling magnetoresistance (TMR) reader, the method comprising:
    providing a TMR structure comprising at least one ferromagnetic layer and at least one nonmagnetic insulating layer;
    performing a first thermal annealing process on the TMR structure;
    performing a reader pattern definition process on the TMR structure to obtain a patterned TMR reader; and
    performing a second thermal annealing process on the patterned TMR reader,
    wherein the at least one ferromagnetic layer comprises a pinning layer, a pinned layer, and a free layer; and the at least one nonmagnetic insulating layer comprises a tunneling barrier layer disposed between the pinned layer and the free layer.

2. The method of claim 1, wherein the reader pattern definition process comprises an ion milling operation.

3. The method of claim 1, wherein the TMR structure further comprises a capping layer deposited over the free layer, further wherein the first thermal annealing process is performed after depositing the capping layer.

4. The method of claim 1, wherein the first thermal annealing process is performed while applying an external magnetic field to the TMR structure, thereby inducing a pinning field in the pinning layer and defining a direction of the pinning field.

5. The method of claim 1, further comprising the step of disposing a spacing layer over the patterned TMR reader and a hard bias layer over the insulating layer.

6. The method of claim 5, wherein the spacing layer comprises an atomic layer deposition (ALD) aluminum oxide.

7. The method of claim 5, wherein the hard bias layer comprises a composition of cobalt and platinum.

8. The method of claim 5, wherein the second thermal annealing process enhances an effective hard bias field inside the patterned TMR reader.

9. The method of claim 1, wherein a second annealing temperature for the second thermal annealing process is equal to or lower than a first annealing temperature for the first thermal annealing process.

10. The method of claim 9, wherein the first annealing temperature is in a range of between about 250 and 300° C., and the second annealing temperature is in a range of between about 220 and 270° C.

11. The method of claim 1, wherein a second soaking time for the second thermal annealing process is equal to or lower than a first soaking time for the first thermal annealing process.

12. The method of claim 11, wherein the first soaking time is in a range of between about 2 and 5 hours, and the second soaking time is in a range of between about 10 minutes and 1 hour.

13. The method of claim 1 further comprising performing a writer pattern definition process to form a patterned writer associated with the patterned TMR reader.

14. The method of claim 13 further comprising performing a third thermal annealing process after forming the patterned writer.

15. The method of claim 14, wherein the third thermal annealing process improves an overwrite capability of the patterned writer.

16. The method of claim 14, wherein a third annealing temperature for the third thermal annealing process is equal to or lower than a first annealing temperature for the first thermal annealing process.

17. The method of claim 16, wherein the first annealing temperature is in a range of between about 250 and 300° C., and the third annealing temperature is in a range of between about 190 and 240° C.

18. The method of claim 14, wherein a third soaking time for the third thermal annealing process is equal to or lower than a first soaking time for the first thermal annealing process.

19. The method of claim 18, wherein the first soaking time is in a range of between about 2 and 5 hours, and the third soaking time is in a range of between about 10 minutes and 2 hours.

* * * * *